(12) United States Patent
Rodov et al.

(10) Patent No.: US 6,743,703 B2
(45) Date of Patent: Jun. 1, 2004

(54) POWER DIODE HAVING IMPROVED ON RESISTANCE AND BREAKDOWN VOLTAGE

(75) Inventors: Vladimir Rodov, Redondo Beach, CA (US); Paul Chang, Saratoga, CA (US); Jianren Bao, Fullerton, CA (US); Wayne Y. W. Hsueh, San Jose, CA (US); Arthur Ching-Lang Chiang, Saratoga, CA (US); Geeng-Chuan Chern, Cupertino, CA (US)

(73) Assignee: APD Semiconductor, Inc., San Jose, CA (US)

( * ) Notice: Subject to any disclaimer, the term of this patent is extended or adjusted under 35 U.S.C. 154(b) by 35 days.

(21) Appl. No.: 10/238,104

(22) Filed: Sep. 9, 2002

(65) Prior Publication Data

US 2003/0006473 A1 Jan. 9, 2003

Related U.S. Application Data

(63) Continuation-in-part of application No. 09/544,730, filed on Apr. 6, 2000, now Pat. No. 6,448,160.

(51) Int. Cl.[7] .......................... H01L 29/74; H01L 27/01; H01L 23/62; H01L 23/58; H01L 29/06
(52) U.S. Cl. ...................... 438/527; 257/341; 257/495; 257/653; 257/401; 257/133; 257/155; 257/355
(58) Field of Search .................................. 257/341, 495, 257/653, 401, 342, 139, 133, 149, 147, 155, 355, 135

(56) References Cited

U.S. PATENT DOCUMENTS

| | | | |
|---|---|---|---|
| 3,603,811 A | 9/1971 | Day | |
| 4,373,252 A | 2/1983 | Caldwell | |
| 4,754,310 A | 6/1988 | Coe | |
| 4,982,260 A | 1/1991 | Chang et al. | |
| 4,996,581 A | 2/1991 | Hamasaki | |
| 5,162,876 A | * 11/1992 | Kitagawa et al. | 257/138 |
| 5,216,275 A | 6/1993 | Chen | |
| 5,430,315 A | 7/1995 | Rumennik | |
| 5,438,215 A | 8/1995 | Tihanyi | |
| 5,594,261 A | * 1/1997 | Temple | 257/140 |
| 5,629,536 A | 5/1997 | Heminger et al. | |
| 5,643,809 A | 7/1997 | Lien | |
| 5,747,841 A | 5/1998 | Ludikuize | |
| 5,751,025 A | 5/1998 | Heminger et al. | |
| 5,818,084 A | 10/1998 | Williams et al. | |
| 5,825,079 A | 10/1998 | Metzler et al. | |
| 5,869,380 A | 2/1999 | Chang | |
| 5,877,515 A | 3/1999 | Ajit | |
| 5,886,383 A | * 3/1999 | Kinzer | 257/341 |
| 5,956,582 A | 9/1999 | Ayela et al. | |
| 5,969,400 A | * 10/1999 | Shinohe et al. | 257/492 |
| 6,034,385 A | 3/2000 | Stephani et al. | |
| 6,037,631 A | 3/2000 | Deboy et al. | |
| 6,066,878 A | 5/2000 | Neilson | |
| 6,081,009 A | * 6/2000 | Neilson | 257/341 |
| 6,097,046 A | 8/2000 | Plumton | |
| 6,186,408 B1 | 2/2001 | Rodov et al. | |
| 6,225,180 B1 | 5/2001 | Fujii | |
| 6,235,601 B1 | 5/2001 | Kim | |
| 6,258,634 B1 | 7/2001 | Wang et al. | |
| 6,274,904 B1 | 8/2001 | Tihanyi | |
| 6,313,001 B1 | 11/2001 | Johansson et al. | |
| 6,323,091 B1 | 11/2001 | Lee et al. | |
| 6,362,036 B1 | 3/2002 | Choizzie et al. | |
| 6,448,160 B1 | 9/2002 | Chang et al. | |

FOREIGN PATENT DOCUMENTS

| | | |
|---|---|---|
| EP | 322 040 | 6/1989 |
| JP | 406061250 | 3/1993 |
| JP | 405082534 | 4/1993 |
| JP | 405175206 | 7/1993 |
| JP | 406112149 | 4/1994 |

OTHER PUBLICATIONS

Cezac et al., "A New Generation of Power Unipolar Devices: the Concept of the Floating Islands MOS Transistor (FLIMOST)," *Proc. of ISPSO 2000*, pp. 69–72, conference held May 22–25, 2000 in Toulouse France (2000).

Christiansen, B., "Synchronous Rectification Improves with Age," *PCIM*, pp. 1–6 (1998).

Daniel et al., "Modeling of the CoolMOS™ Transistor—Part I: Device Physics," *IEEE Transactions on Electron Devices*, 49(5):916–922 (2002).

Daniel et al., "Modeling of the CoolMOS™ Transistor—Part II: DC Model and Parameter Extraction," *IEEE Transactions on Electron Devices*, 49(5):923–929 (2002).

Fujishima et al., "A High Density, Low On–resistance, Trench Lateral Power MOSFET with a Trench Bottom Source Contact," *Proc. 2001 Symp. on Power Semiconductor Devices and IC's*, pp. 143–146, held in Osaka Japan (2001).

Gan et al., "Poly Flanked VDMOS (PFVDOS): A Superior Technology for Superjunction Devices," *IEEE*, pp. 2156–2159 (2001).

(List continued on next page.)

*Primary Examiner*—Matthew Smith
*Assistant Examiner*—Chuong A Luu
(74) *Attorney, Agent, or Firm*—Beyer Weaver & Thomas, LLP

(57) ABSTRACT

A two-terminal power diode has improved reverse bias breakdown voltage and on resistance includes a semiconductor body having two opposing surfaces and a superjunction structure therebetween, the superjunction structure including a plurality of alternating P and N doped regions aligned generally perpendicular to the two surfaces. The P and N doped regions can be parallel stripes or a mesh with each region being surrounded by doped material of opposite conductivity type. A diode junction associated with one surface can be an anode region with a gate controlled channel region connecting the anode region to the superjunction structure. Alternatively, the diode junction can comprise a metal forming a Schottky junction with the one surface. The superjunction structure is within the cathode and spaced from the anode. The spacing can be varied during device fabrication.

7 Claims, 2 Drawing Sheets

OTHER PUBLICATIONS

Huang et al., "Characterization of Paralleled Super Junction MOSFET Devices under Hard– and Soft–Switching Conditions," *IEEE*, pp. 2145–2150 (2001).

Kim et al., "Minimization of reverse Recovery Effects in Hard–Switched Inverters using CoolMOS" Power Switches, *IEEE*, pp. 641–647 (2001).

Kim et al., "A Novel Process Technique for Fabricating High Reliable Trench DMOSFETs using Self–Align Technique and Hydrogen Annealing," *Proc. 2001 Int. Symp. on Power Semiconductor Devices and ICs*, pp. 139–142, held in Osaka Japan (2001).

Minato et al., "Which is cooler, Trench or Multi–Epitaxy?," *Proc. of ISPSO 2000*, pp. 73–76, conference held May 22–25, 2000 in Toulouse France (2000).

Nitta et al., "Experimental Results and Simulation Analysis of 250V Super Trench Power MOSFET (STM)," *Proc. of ISPSO 2000*, pp. 77–80, conference held May 22–25, 2000 in Toulouse France (2000).

Saggio et al., "MDmesh™: innovative technology for high voltage PowerMOSFETs," *Proc. of ISPSO 2000*, pp. 65–68, conference held May 22–25, 2000 in Toulouse France (2000).

Shimizu et al., "100V Trench MOS Barrier Schottky Rectifier Using Thick Oxide Layer (TO–TMBS)," *Proc. 2001 Int. Symp. on Power Semiconductor Devices and ICs*, pp. 243–246, held in Osaka Japan (2001).

Udrea et al., "Ultra–high voltage termination using the 3D RESURF (Super–Junction) concept—experimental demonstration at 6.5 kV," *Proc. 2001 Int. Symp. on Power Semiconductor Devices and ICs*, pp. 129–132, held in Osaka Japan (2001).

Zhang et al., "Forward and Reverse Biased Safe Operating Areas of the COOLMOS™," *IEEE*, pp. 81–86 (2000).

Zhang et al., "Analysis of the Forward Biased Safe Operating Area of the Super Junction MOSFET," *Proc. of ISPSO 2000*, pp. 61–64, conference held May 22–25, 2000 in Toulouse France (2000).

* cited by examiner

POWER DIODE HAVING IMPROVED ON RESISTANCE AND BREAKDOWN VOLTAGE

CROSS-REFERENCES TO RELATED APPLICATIONS

This application claims priority from application Ser. No. 09/544,730 filed Apr. 6, 2000 now U.S. Pat. No. 6,448,160.

BACKGROUND OF THE INVENTION

This invention relates generally to power semiconductor diodes and rectifiers, and more particularly the invention relates to a power diode having a reduced on resistance and higher reverse breakdown voltage.

A two-terminal power diode or rectifier must have a low turn-on voltage, fast turn-off voltage, and nonconductance when the diode is reverse biased. In addition, the on-resistance must be low and the reverse bias breakdown voltage must be high. However, the necessary doping for low on-resistance can adversely affect reverse breakdown voltage.

Three-terminal vertical MOSFET devices are known which have an alternating P and N doped channel region for connecting a source region on one surface to a drain region on an opposing surface. The alternating P and N regions provide a balanced space charge and reduced electric field below the critical field strength at which avalanche breakdown would occur. Yet the on resistance is not adversely affected. See for example, U.S. Pat. Nos. 5,216,275; 5,438, 215; 6,274,904; 6,274,904, 6,037,631; and 6,066,878, for example.

The present invention is directed to improving the characteristic of two-terminal power diodes, such as Schottky and gate controlled power diodes, by including a vertical superjunction region having alternating P and N doped regions for connecting an anode on one surface with a cathode on an opposing surface.

BRIEF SUMMARY OF THE INVENTION

In accordance with the invention, a two-terminal power rectifier, such as a Schottky or gate controlled diode, is provided with a conductive channel having alternating P and N doped regions between the two terminals. The alternating doped regions enhance the reverse bias breakdown voltage while maintaining a low on resistance between the two terminals. The connective channel can have stripped P and N doped regions or meshed P and N regions.

The invention and objections and features thereof will be more readily apparent from the following detailed description and the appended claims when taken with the drawings.

DETAILED DESCRIPTION OF THE INVENTION

Figure 1:
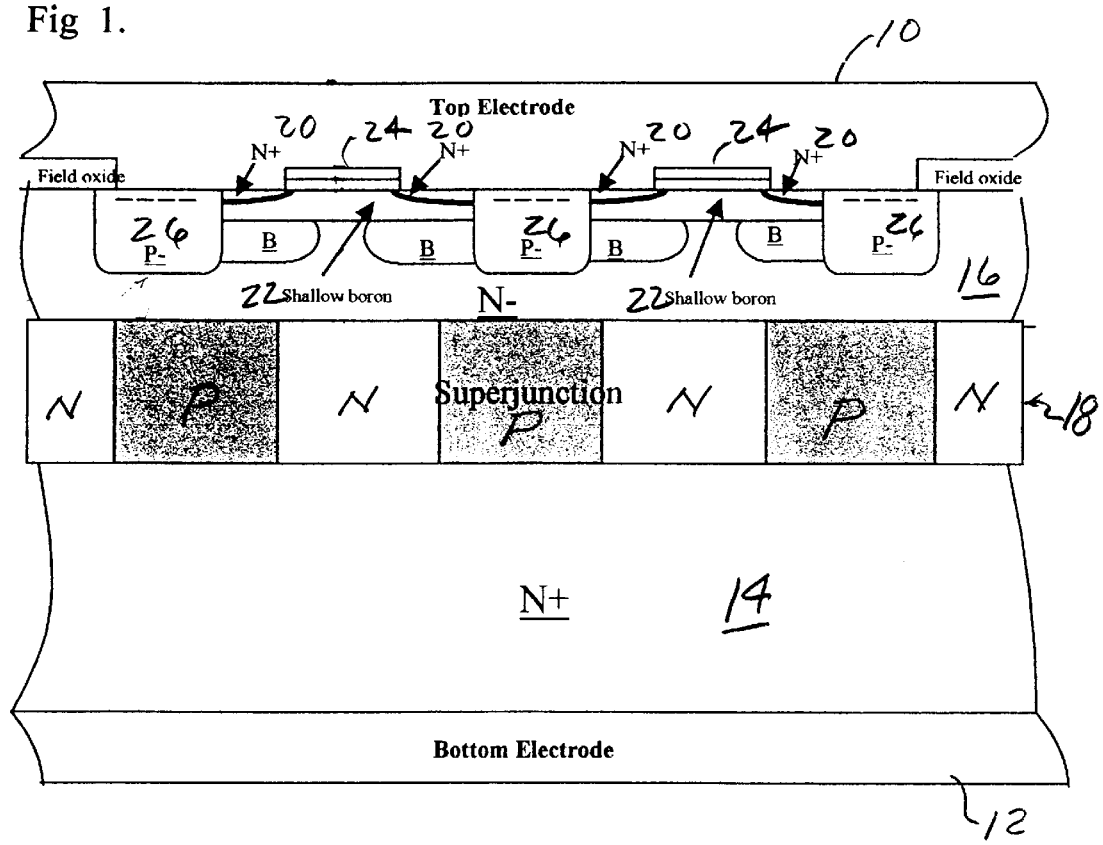
FIG. 1 is a section view of a gate controlled diode rectifier in accordance with one embodiment of the invention.
Figure 2:
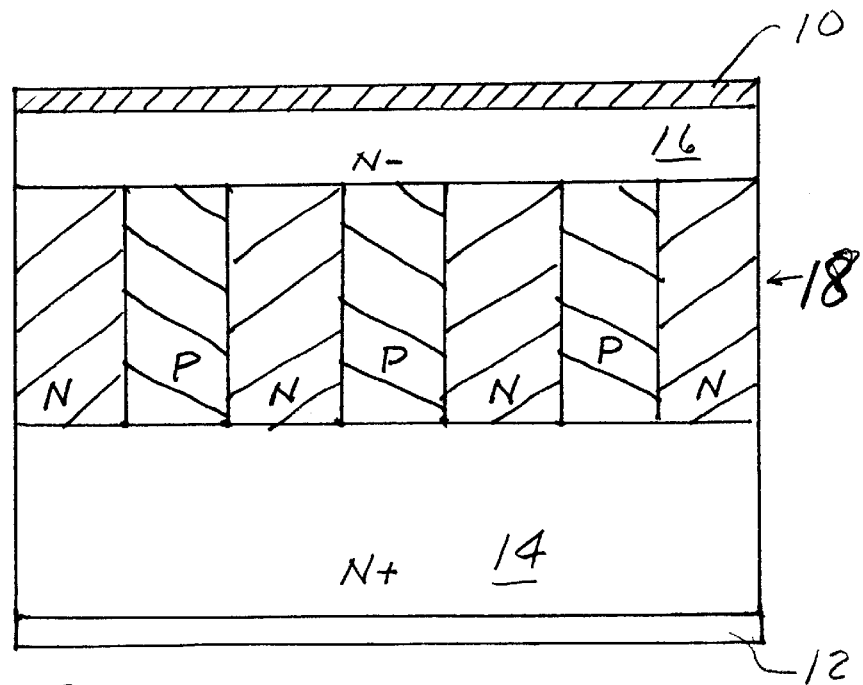
FIG. 2 is a section view of a Schottky diode in accordance with another embodiment of the invention.

FIG. 1 and FIG. 2 are section views illustrating two embodiments of a power diode in accordance with the invention, and like elements have the same reference numerals. Both devices have a top electrode 10 and a bottom electrode 12 on opposing surfaces of a semiconductor structure including an N+ substrate 14, an N– epitaxial layer 16, and a superjunction region 18 between N– epitaxial layer 16 and N+ substrate 14. The superchannel region 18 comprises alternating P and N doped regions placed within the N-doped cathode and spaced from the anode. Importantly, the spacing of the superchannel from the anode can be readily varied during fabrication.

In FIG. 1 a gate controlled diode structure is provided similar to the diode structures in copending application Ser. No. 09/544,730, now U.S. Pat. No. 6,448,160. Similar devices fabricated by different processes are also disclosed in copending application Ser. No. 09/742,262, now U.S. Pat. No. 6,624,030, and application Ser. No. 09/805,815, now U.S. Pat. No. 6,420,225. Briefly, these structures include N+ anodes 20 which communicate with N– epitaxial layer 16 through channel regions formed by shallow boron implant at 22 under gate electrodes 24 with voltages applied to gate 24 controlling the conduction of the channel between anode 20 and N– region 16. Top electrode 10 ohmically contacts anodes 20, gate 24, and P-doped regions 26 formed in the surface of epitaxial layer 16.

The superjunction 18 comprising the alternating N and P doped regions extending between epitaxial layer 16 and N+ substrate 14 can be either alternating stripes, as shown, or a mesh structure in which N and P regions are surrounded by material of opposite conductivity type. Fabrication of the superchannels employs known techniques such as the mesh process disclosed by Saggio et al. in "MDMesh™: innovative technology for high voltage powerMOSFETs," ISPSO 2000, May 22–25, pp 65–68; the super trench method disclosed in Nitta et al., "Experimental Results and Simulation Analysis of 250V Super Trench Power MOSFET (STM)," ISPSO 2000, May 22–25, pp 77–80; and the multi-epitaxy process disclosed by Minato et al. in "Which is cooler, Trench or Multi-Epitaxy?" ISPSO 2000, May 22–25, pp 73–76. As described above, the superjunction structure provides a balanced space charge and reduced electric field below the critical field strength at which avalanche breakdown would occur in similar two-terminal diodes without the superjunction.

In FIG. 2 the gate controlled diode structure of FIG. 1 is replaced by a metal 10 which makes a Schottky junction with N– epitaxial layer 16. Suitable Schottky metals are known and include titanium, molybdenum, platinum, and nickel, for example.

Figure 3A:
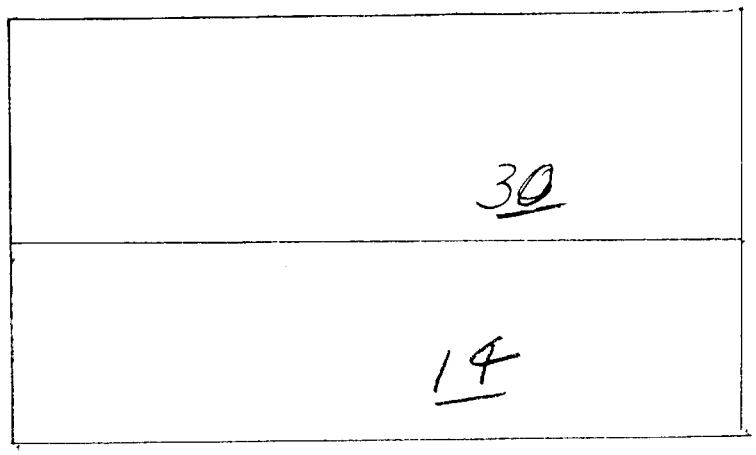
FIGS. 3A–3C are section views illustrating steps in fabricating the power diode of FIGS. 1 and 2.
Figure 3B:
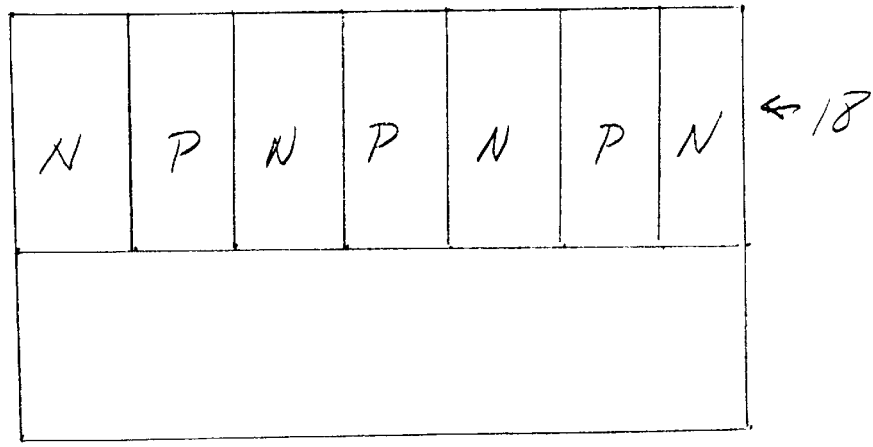
Figure 3C:
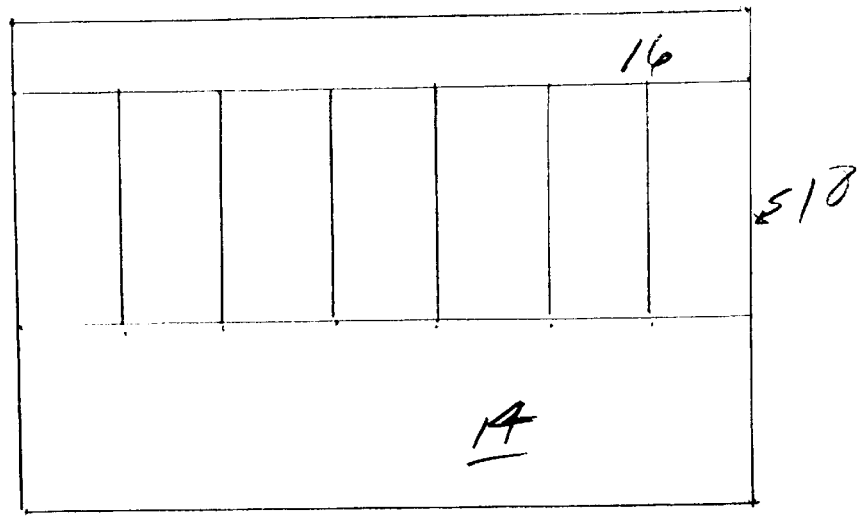

FIGS. 3A–3C are section views illustrating steps in fabricating the diode structures of FIGS. 1 and 2. In FIG. 3A, N+ silicon substrate 14 is provided with an N– or undoped epitaxial layer 30. In FIG. 3B, the superchannel structure 18 is formed using the processes described above, for example. Preferably the alternating doped regions have the same dopant concentration to provide the balanced space charge and reduced electric field below a critical field strength when the diode is reverse biased.

After the superchannel structure is completed, an N-doped epitaxial layer 16 is grown from the single crystal silicon in the superjunction 18 as shown in FIG. 3C. Thereafter, the Schottky material is deposited for completing the Schottky diode of FIG. 2, or the process steps disclosed in the copending applications, supra, are used to form the gate controlled diode structure of FIG. 1.

A two-terminal power diode including a super channel in accordance with the invention improves the reverse bias breakdown voltage of the diode without adversely affecting the on resistance. While the invention has been described with reference to specific applications, the description is illustrative of the invention and is not to be construed as limiting the invention. Various modifications and applications may occur to those skilled in the art without departing from the true spirit and scope of the invention as defined by the appended claims.

What is claimed is:

1. A power diode comprising:
   a) a semiconductor body having two opposing surfaces and a superjunction therebetween, the superjunction structure including a plurality of alternating P and N doped regions aligned generally perpendicular to the two surfaces,
   b) a diode junction associated with one surface, the diode junction comprising an anode region and a gate controlled channel region connecting the anode region to the superjunction structure, the superjunction structure being within a cathode region of the diode and spaced from the anode region, and an ohmic contact metal contacting both the anode region and the gate.

2. The power diode as defined by claim 1 wherein the alternating P and N doped regions are parallel stripes.

3. The power diode as defined by claim 1 wherein the alternating P and N doped regions are a mesh of P and N regions with each region being surrounded by doped material of opposite conductivity type.

4. A power diode comprising:
   a) a semiconductor body having two opposing surfaces and a superjunction therebetween, the superjunction structure including a plurality of alternating P and N doped regions aligned generally perpendicular to the two surfaces,
   b) a diode junction associated with one surface, the diode junction comprising a metal on the one surface and forming a Schottky junction therewith, the superjunction structure being within a cathode region of the diode and spaced from the diode junction, and
   c) an ohmic contact on the other surface.

5. The power diode as defined by claim 4 wherein the alternating P and N doped regions are parallel stripes.

6. The power diode as defined by claim 4 wherein the alternating P and N doped regions are a mesh of P and N regions with each region being surrounded by doped material of opposite conductivity type.

7. The power diode as defined by claim 4 wherein the metal is selected from the group consisting of platinum, titanium, molybdenum, and nickel.

* * * * *